(12) United States Patent
Lin et al.

(10) Patent No.: US 10,332,991 B2
(45) Date of Patent: Jun. 25, 2019

(54) METAL GATE ELECTRODE OF A SEMICONDUCTOR DEVICE

(71) Applicant: Taiwan Semiconductor Manufacturing Company, Ltd., Hsinchu (TW)

(72) Inventors: Jr-Jung Lin, Hsinchu (TW); Chih-Han Lin, Hsinchu (TW); Jin-Aun Ng, Hsinchu (TW); Ming-Ching Chang, Hsinchu (TW); Chao-Cheng Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 5 days.

(21) Appl. No.: 15/997,126

(22) Filed: Jun. 4, 2018

(65) Prior Publication Data
US 2018/0350966 A1    Dec. 6, 2018

Related U.S. Application Data

(63) Continuation of application No. 13/484,047, filed on May 30, 2012, now Pat. No. 9,991,375.

(51) Int. Cl.
| | |
|---|---|
| H01L 29/66 | (2006.01) |
| H01L 29/49 | (2006.01) |
| H01L 21/8238 | (2006.01) |
| H01L 29/78 | (2006.01) |
| H01L 21/283 | (2006.01) |

(52) U.S. Cl.
CPC ............ *H01L 29/78* (2013.01); *H01L 21/283* (2013.01); *H01L 21/823842* (2013.01); *H01L 29/4966* (2013.01); *H01L 29/4983* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 5,293,056 A | 3/1994 | Terashima | |
| 6,864,163 B1 | 3/2005 | Yu et al. | |
| 8,304,841 B2 | 11/2012 | Xu et al. | |
| 2004/0188726 A1 | 9/2004 | Iriyama et al. | |
| 2005/0101134 A1 | 5/2005 | Brask et al. | |
| 2008/0135952 A1 | 6/2008 | Brask et al. | |
| 2008/0290415 A1* | 11/2008 | Okazaki | H01L 21/823835 257/365 |

(Continued)

FOREIGN PATENT DOCUMENTS

KR    1020110029076 A    3/2011

*Primary Examiner* — Joseph C. Nicely
*Assistant Examiner* — Lamont B Koo
(74) *Attorney, Agent, or Firm* — Slater Matsil, LLP

(57) ABSTRACT

Embodiments relate to integrated circuit fabrication, and more particularly to a metal gate electrode. An exemplary structure for a semiconductor device comprises a substrate comprising a major surface; a first gate electrode on the major surface comprising a first layer of multi-layer material; a first dielectric material adjacent to one side of the first gate electrode; and a second dielectric material adjacent to the other 3 sides of the first gate electrode, wherein the first dielectric material and the second dielectric material collectively surround the first gate electrode.

20 Claims, 16 Drawing Sheets

(56) References Cited

U.S. PATENT DOCUMENTS

2008/0296667 A1 12/2008 Mikasa
2009/0057769 A1 3/2009 Wei et al.
2010/0052067 A1 3/2010 Hsu et al.

* cited by examiner

METAL GATE ELECTRODE OF A SEMICONDUCTOR DEVICE

PRIORITY CLAIM AND CROSS-REFERENCE

This application is a continuation of U.S. patent application Ser. No. 13/484,047, entitled "Metal Gate Electrode of a Semiconductor Device," filed May 30, 2012, which application is incorporated herein by reference.

BACKGROUND

As technology nodes shrink, in some integrated circuit (IC) designs, there has been a desire to replace the common polysilicon gate electrode with a metal gate electrode to improve device performance with the decreased feature sizes. One process of forming a metal gate structure is termed a "gate last" process in which the final gate structure is fabricated "last" which allows for reduced number of subsequent processes, including high temperature processing, that are to be performed after formation of the gate.

However, there are challenges to implementing such features and processes in complementary metal-oxide-semiconductor (CMOS) fabrication. As the gate width and space between devices decrease, these problems are exacerbated. For example, in a "gate last" fabrication process, it is difficult to achieve a low gate resistance for a semiconductor device because voids are generated in the metal gate electrode after metal layer deposition for gap filling of a high-aspect-ratio trench, thereby increasing the likelihood of device instability and/or device failure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
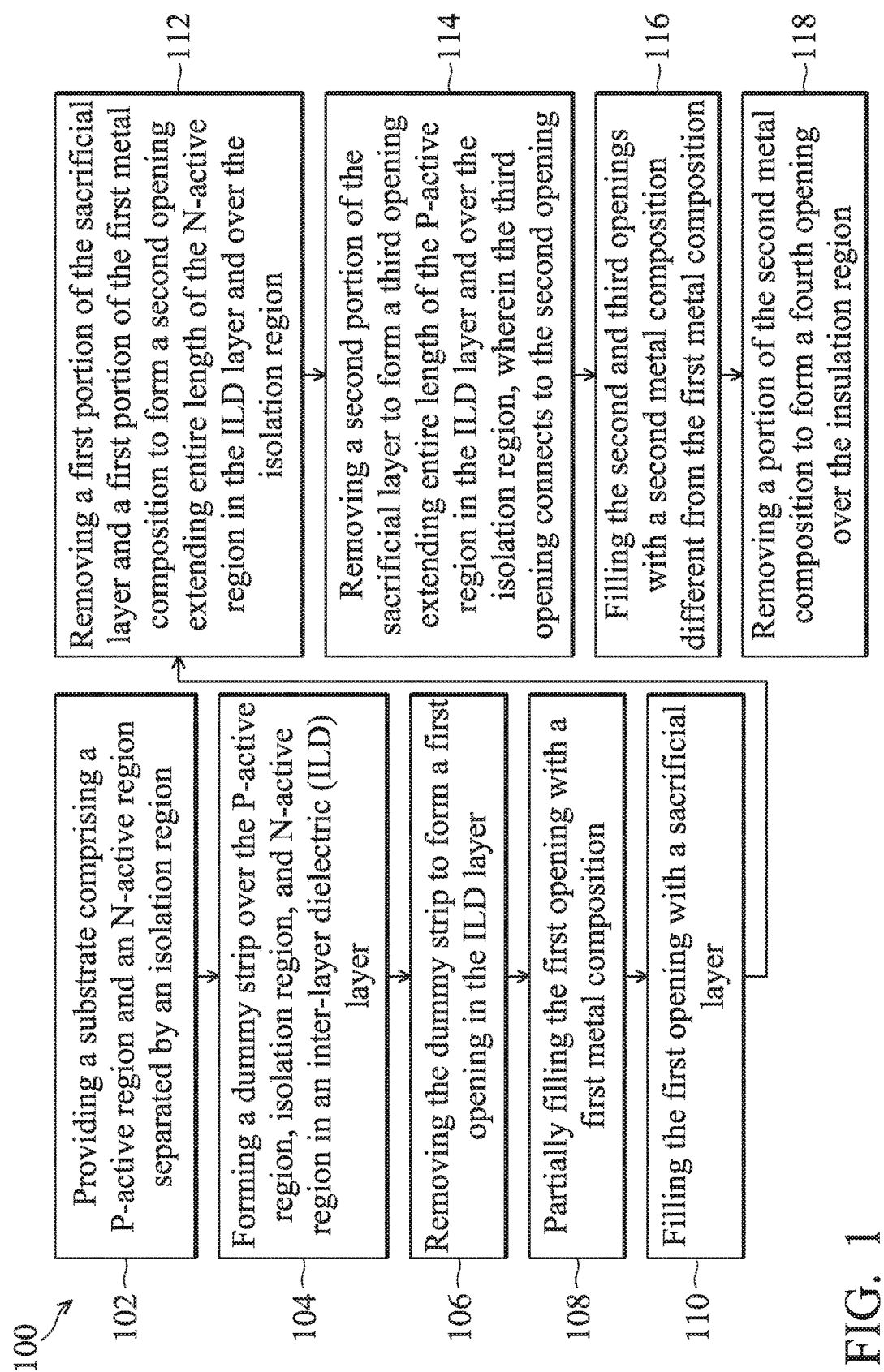
FIG. 1 is a flowchart illustrating a method of fabricating a metal gate electrode of a semiconductor device according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. Further, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however, one skilled in the art may recognize applicability to other processes and/or use of other materials.

Figure 2:
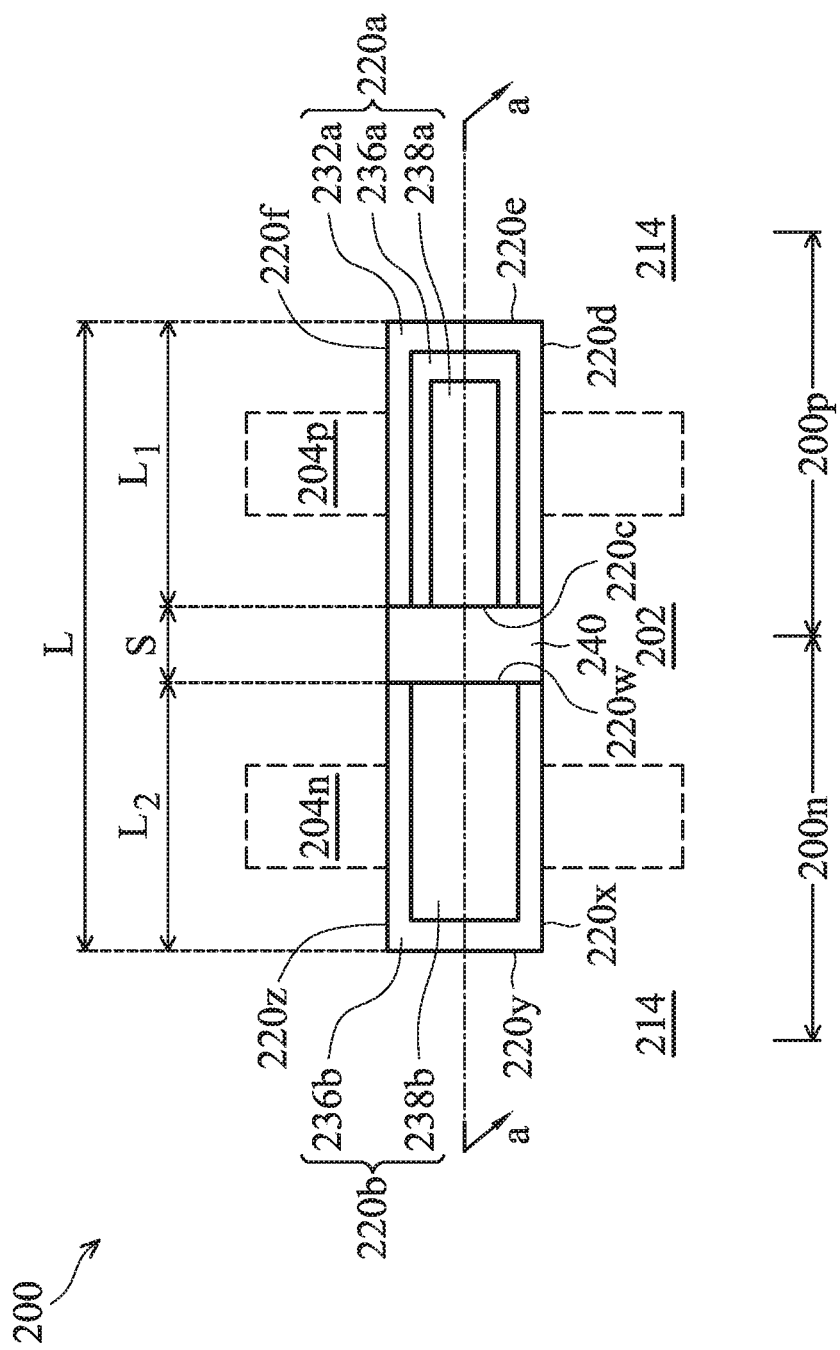
FIG. 2 shows a top view of a semiconductor device comprising a metal gate electrode according to various aspects of the present disclosure.

FIG. 1 is a flowchart illustrating a method 100 of fabricating a metal gate electrode 220 of a semiconductor device 200 (shown in FIGS. 2, 11, and 12) according to various aspects of the present disclosure. FIG. 2 shows a top view of a semiconductor device 200 comprising a metal gate electrode 220 according to various aspects of the present disclosure. FIGS. 3-12 show cross-section views of the semiconductor device 200 taken along line a-a of FIG. 2 at various stages of fabrication according to various aspects of the present disclosure. Each figure denoted with a letter "A" shows a perpendicular embodiment in FIG. 2; each figure denoted with a letter "B" shows a tapered embodiment in FIG. 2; and each figure denoted with a letter "C" shows an irregular embodiment in FIG. 2.

It is noted that part of the semiconductor device 200 may be fabricated with complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 12 are simplified for a better understanding of the concepts of the present disclosure. For example, although the figures illustrate a metal gate structure 220 for the semiconductor device 200, it is understood the semiconductor device 200 may be part of an integrated circuit (IC) that may comprise a number of other devices comprising resistors, capacitors, inductors, fuses, etc.

FIG. 2 shows a top view of a semiconductor device 200 comprising a metal gate electrode 220 fabricated by a "gate last" process. In the depicted embodiment, the semiconductor device 200 comprises a substrate 202 comprising a major surface 202s (shown in FIG. 3); a first rectangular gate electrode 220a on the major surface 202s comprising a first layer of multi-layer material; a first dielectric material 240 adjacent to one side 220c of the first rectangular gate electrode 220a; and a second dielectric material 214 adjacent to the other 3 sides 220d, 220e, and 220f of the first rectangular gate electrode 220a, wherein the first dielectric material 240 and the second dielectric material 214 collectively surround the first rectangular gate electrode 220a.

In some embodiments, the semiconductor device 200 further comprises a second rectangular gate electrode 220b on the major surface 202s comprising a second layer of multi-layer material, wherein the first dielectric material 240 is adjacent to one side 220w of the second rectangular gate electrode 220b and the second dielectric material 214 is adjacent to the other 3 sides 220x, 220y, and 220z of the second rectangular gate electrode 220b, wherein the first dielectric material 240 and the second dielectric material 214 collectively surround the second rectangular gate electrode 220b.

Conventionally, in a "gate last" fabrication process, a first trench with a first length $L_1$ and a second trench with a second length $L_2$ are surrounded by an inter-layer dielectric (ILD) layer and separated by a space S. The first trench can accommodate a first layer of multi-layer material to form the first rectangular gate electrode 220a, while the second trench can accommodate a second layer of multi-layer material to form the second rectangular gate electrode 220b. However, each of the first trench and second trench can accommodate a layer of less multi-layer material as the gate length and space between devices decrease. This may cause voids generation in the first and second rectangular gate electrodes 220a, 220b after metal layer deposition for gap filling of a high-aspect-ratio trench, thereby increasing the likelihood of device instability and/or device failure.

In the depicted embodiment, a trench surrounded by an ILD layer has a length L. The length L is a summation of the first length $L_1$, the second length $L_2$, and the space S, which is longer than each of the first length $L_1$, the second length $L_2$, and the space S. The longer trench has a low-aspect-ratio and can be more effective to fill the trench with a layer of multilayer material. After filling the trench with a layer of multilayer material, a portion of the layer of multilayer material on the space S is removed to form a first rectangular gate electrode and a second rectangular gate electrode. Then, a dielectric material fills the removed portion to isolate the first and second rectangular gate electrodes. Accordingly, Applicant's method of fabricating a semiconductor device 200 may avoid voids generation in the first and second rectangular gate electrodes 220a, 220b after metal layer deposition for gap filling of a low-aspect-ratio trench. Thus, the first and second rectangular gate electrodes 220a, 220b maintain their original work function, thereby not changing the threshold voltage of the semiconductor device 200.

Figure 3:
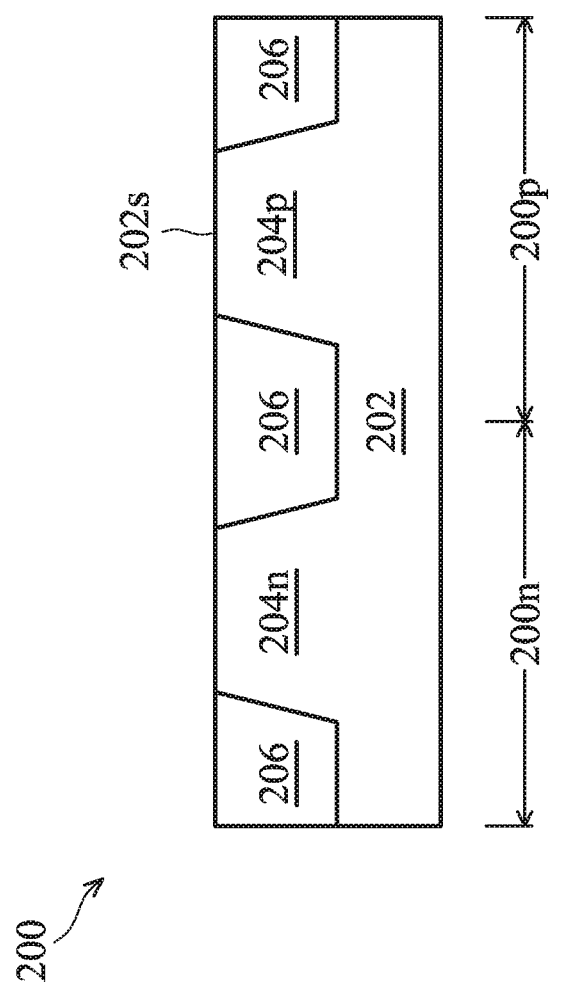
FIGS. 3-10, 11A, 11B, 11C, 12A, 12B, and 12C show cross-section views of the semiconductor device taken along line a-a of FIG. 2 at various stages of fabrication according to various aspects of the present disclosure.

Referring to FIG. 3, the method 100 begins at step 102 wherein a substrate 202 is provided. The substrate 202 may comprise a silicon substrate. In some embodiments, the substrate 202 may alternatively comprise silicon germanium, gallium arsenide, or other suitable semiconductor materials. The substrate 202 may further comprise other features such as various doped regions, a buried layer, and/or an epitaxy layer. Furthermore, the substrate 202 may be a semiconductor on insulator such as silicon on insulator (SOI). In other embodiments, the semiconductor substrate 202 may comprise a doped epi layer, a gradient semiconductor layer, and/or may further include a semiconductor layer overlying another semiconductor layer of a different type such as a silicon layer on a silicon germanium layer. In other examples, a compound semiconductor substrate may comprise a multilayer silicon structure or a silicon substrate may include a multilayer compound semiconductor structure. In the depicted embodiment, the substrate 202 comprises a major surface 202s.

In some embodiments, the semiconductor substrate 202 comprises a P-active region 204p and an N-active region 204n (dotted lines in FIG. 2) separated by an isolation region 206. The active regions 204p, 204n may include various doping configurations depending on design requirements. For example, the P-active region 204p is doped with n-type dopants, such as phosphorus or arsenic; the N-active region 204n is doped with p-type dopants, such as boron or $BF_2$. As such, the P-active region 204p may be usable for forming a p-type Metal Oxide Semiconductor Field Effect Transistor (pMOSFET) 200p, while the N-active region 204n may be usable for forming an n-type Metal Oxide Semiconductor Field Effect Transistor (nMOSFET) 200n.

Isolation region 206 may be formed on the substrate 202 to isolate the various active regions 204p, 204n from each other. The isolation regions 206 may utilize isolation technology, such as local oxidation of silicon (LOCOS) or shallow trench isolation (STI), to define and electrically isolate the various active regions 204p, 204n. In the present embodiment, the isolation region 206 comprises a STI. The isolation regions 206 may comprise materials such as silicon oxide, silicon nitride, silicon oxynitride, fluoride-doped silicate glass (FSG), a low-k dielectric material, and/or combinations thereof. The isolation regions 206, and in the present embodiment, the STI, may be formed by any suitable process. As one example, the formation of the STI may include patterning the semiconductor substrate 202 by a photolithography process, etching a trench in the substrate 202 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Figure 4:
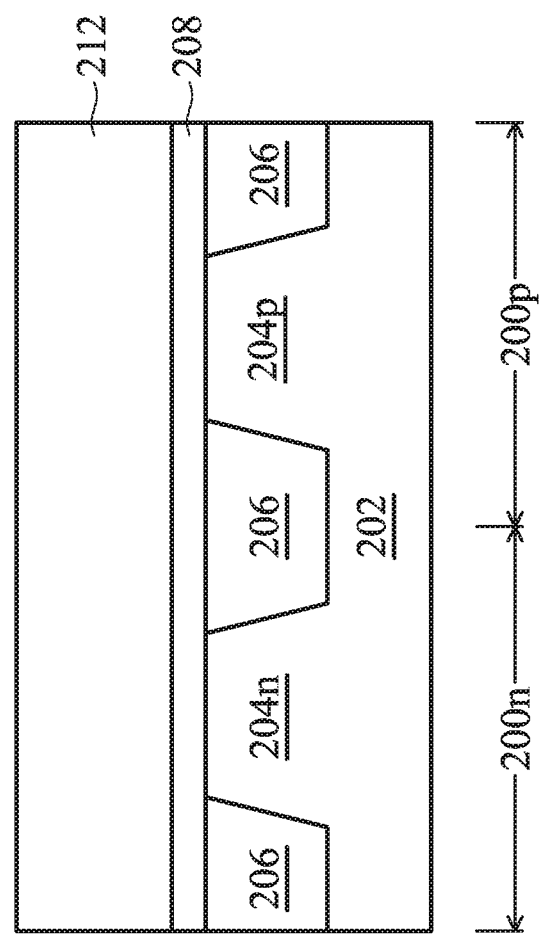
Figure 5:
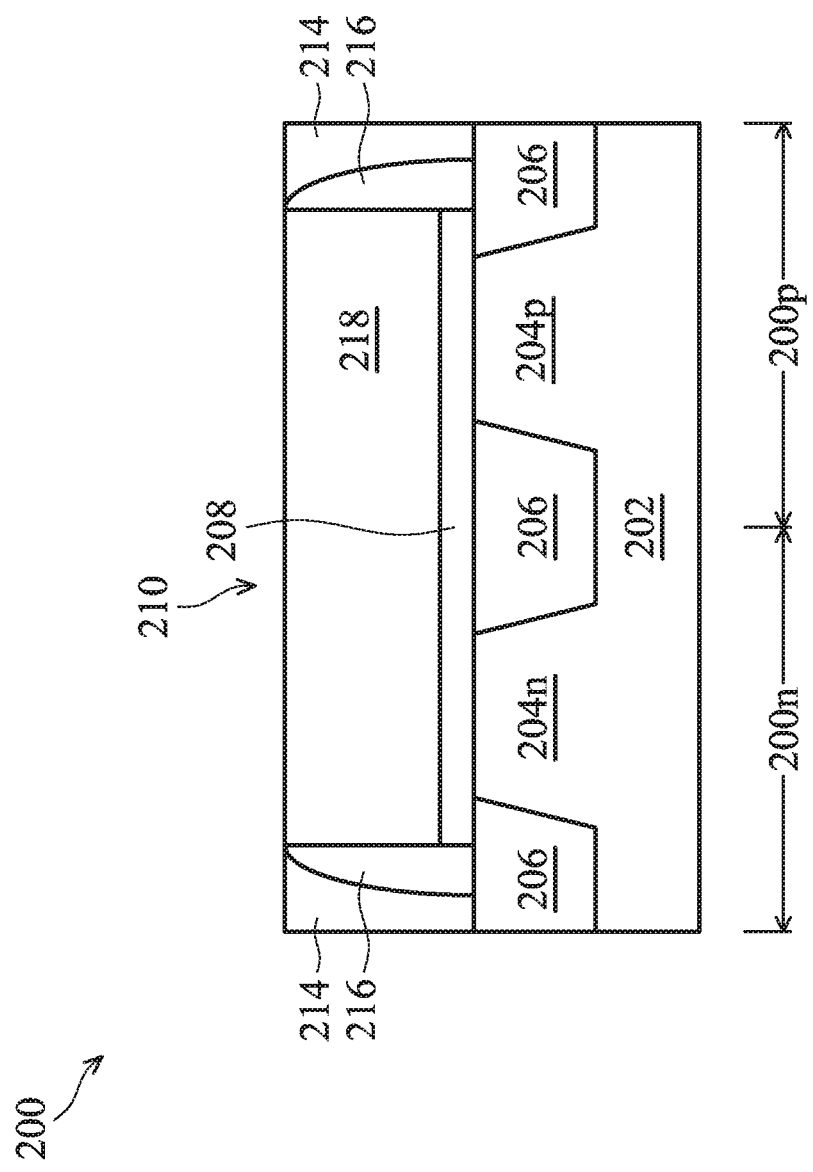

The method 100 in FIG. 1 continues with step 104 in which the structure in FIG. 4 is produced by forming a dummy strip 218 (see FIG. 5) over the P-active region 204p, the isolation region 206, and the N-active region 204n in an inter-layer dielectric (ILD) layer 214 (i.e. the second dielectric material 214 in FIG. 2).

In the depicted embodiment, a gate dielectric layer 208 may be formed over the substrate 202, as shown in FIG. 4. In some embodiments, the gate dielectric layer 208 may comprise silicon oxide, silicon nitride, silicon oxy-nitride, or high-k dielectric. High-k dielectrics comprise certain metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or mixtures thereof. In the present embodiment, the gate dielectric layer 208 is a high-k dielectric layer comprising $HfO_x$ with a thickness in the range of about 10 to 30 angstroms. The gate dielectric layer 208 may be formed using a suitable process such as atomic layer deposition (ALD), chemical vapor deposition (CVD), physical vapor deposition (PVD), thermal oxidation, UV-ozone oxidation, or combinations thereof. The gate dielectric layer 208 may further comprise an interfacial layer (not shown) to reduce damage between the gate dielectric layer 208 and the substrate 202. The interfacial layer may comprise silicon oxide.

In a gate last process, a dummy gate electrode layer 212 is subsequently formed over the gate dielectric layer 208. In some embodiments, the dummy gate electrode layer 212 may comprise a single layer or multilayer structure. In the present embodiment, the dummy gate electrode layer 212 may comprise poly-silicon. Further, the dummy gate electrode layer 212 may be doped poly-silicon with uniform or gradient doping. The dummy gate electrode layer 212 may have a thickness in the range of about 30 nm to about 60 nm. The dummy electrode layer 212 may be formed using a low-pressure chemical vapor deposition (LPCVD) process. In one embodiment, the LPCVD process can be carried out in a standard LPCVD furnace at a temperature of about 580° C. to 650° C., and at a pressure of about 200 mTorr to 1 Torr, using silane ($SiH_4$) or dichlorosilane ($SiH_2Cl_2$) as the silicon source gas.

Then, the dummy gate electrode layer 212 and the gate dielectric layer 208 are patterned to produce the structure shown in FIG. 4 and depicted in step 104. A layer of photoresist (not shown) is formed over the dummy gate electrode layer 212 by a suitable process, such as spin-on coating, and patterned to form a patterned photoresist feature over the dummy gate electrode layer 212 by a lithography patterning method. In the depicted embodiment, the patterned photoresist feature defines an area comprising the first rectangular gate electrode 220a, the second rectangular gate electrode 220b, and the first dielectric material 240 (shown in FIG. 2). The patterned photoresist feature can then be transferred using a dry etching process to the underlying layers (i.e., the gate dielectric layer 208 and the dummy gate electrode layer 212) to form a dummy gate stack 210. The remaining portion of the dummy gate electrode layer 212 is referred to as a dummy strip 218 hereafter. In some embodiments, the dummy strip 218 is substantially perpendicular to the major surface 202s. In some embodiments, the dummy strip 218 comprises a tapered sidewall (not shown) to the major surface 202s. The photoresist layer may be stripped thereafter.

In another example, a hard mask layer (not shown) is formed over the dummy gate electrode layer 212; a patterned photoresist layer is formed on the hard mask layer; the pattern of the photoresist layer is transferred to the hard mask layer and then transferred to the dummy gate electrode layer 212 and the gate dielectric layer 208 to form the dummy gate stack 210. The hard mask layer comprises silicon oxide. In some alternative embodiments, the hard mask layer may optionally comprise silicon nitride, and/or silicon oxynitride, and may be formed using a method such as CVD or PVD. The hard mask layer comprises a thickness in the range from about 100 to 800 angstroms.

It is noted that the semiconductor device 200 may undergo other "gate last" processes and other CMOS technology processing to form various features of the semiconductor device 200. As such, the various features are only briefly discussed herein. The various components of the semiconductor device 200 may be formed prior to formation of the first rectangular gate electrode 220a and the second rectangular gate electrode 220b in a "gate last" process. The various components may comprise lightly doped source/drain regions (p-type and n-type LDD) and source/drain regions (p-type and n-type S/D) (not shown) in the active regions 204p, 204n and on opposite sides of the dummy gate stack 210. The p-type LDD and S/D regions may be doped with B or In, and the n-type LDD and S/D regions may be doped with P or As. The various features may further comprise an ILD layer 214 surrounding the dummy gate stack 210. The ILD layer 214 may include an oxide formed by a high-aspect-ratio process (HARP) and/or a high-density-plasma (HDP) deposition process. As such, the dummy strip 218 is over the P-active region 204p, the isolation region 206, and the N-active region 204n in the ILD layer 214. The various features may optionally comprise forming a gate spacer 216 between the dummy gate stack 210 and the ILD layer 214. The gate spacer 216 may be formed of silicon oxide, silicon nitride or other suitable materials.

Figure 6:
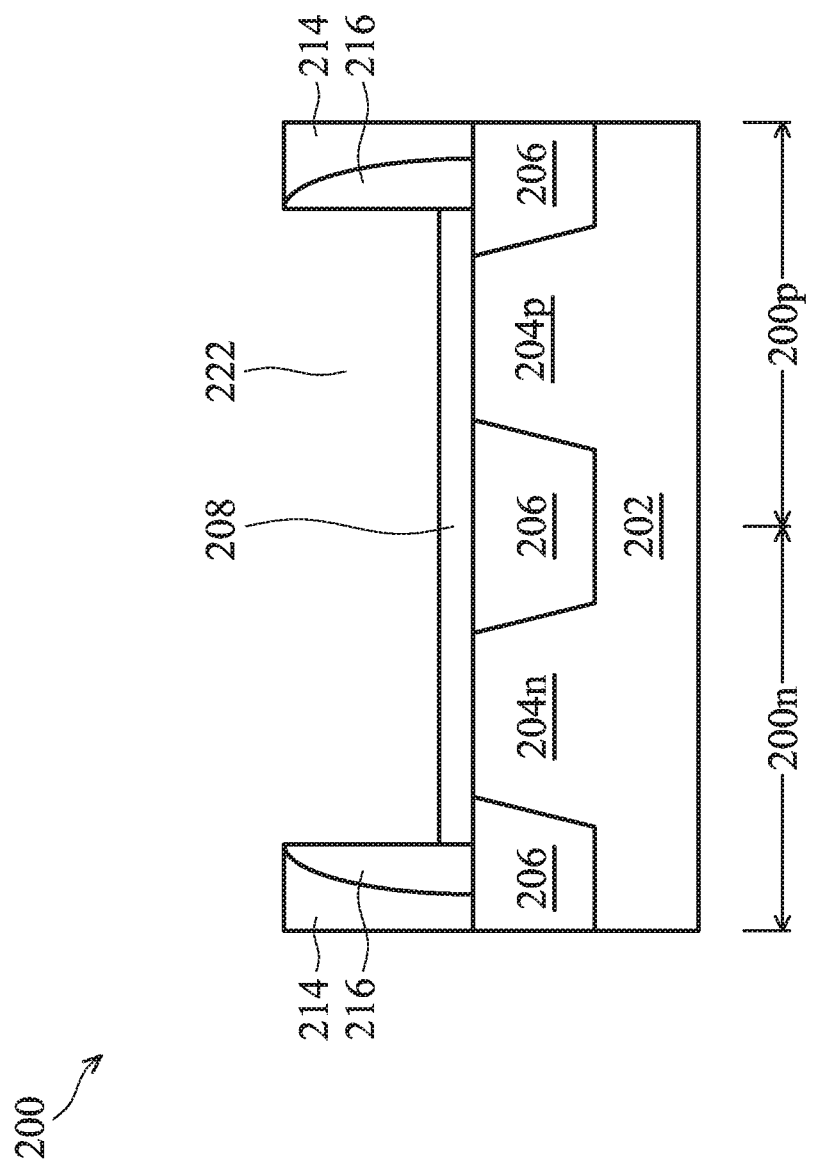

The method 100 in FIG. 1 continues with step 106 in which the structure in FIG. 6 is produced by removing the dummy strip 218 to form a first opening 222 in the ILD layer 214 over the first and second active regions 204n, 204p, that extends over the isolation region 206. In the present embodiment, using the ILD layer 214 as a hard mask, the dummy strip 218 is removed to form the first opening 222 in the ILD layer 214. The dummy strip 218 may be removed using a dry etch process. In one embodiment, the dry etch process may be performed under a source power of about 650 to 800 W, a bias power of about 100 to 120 W, and a pressure of about 60 to 200 mTorr, using $Cl_2$, HBr and He as etching gases.

Figure 7:
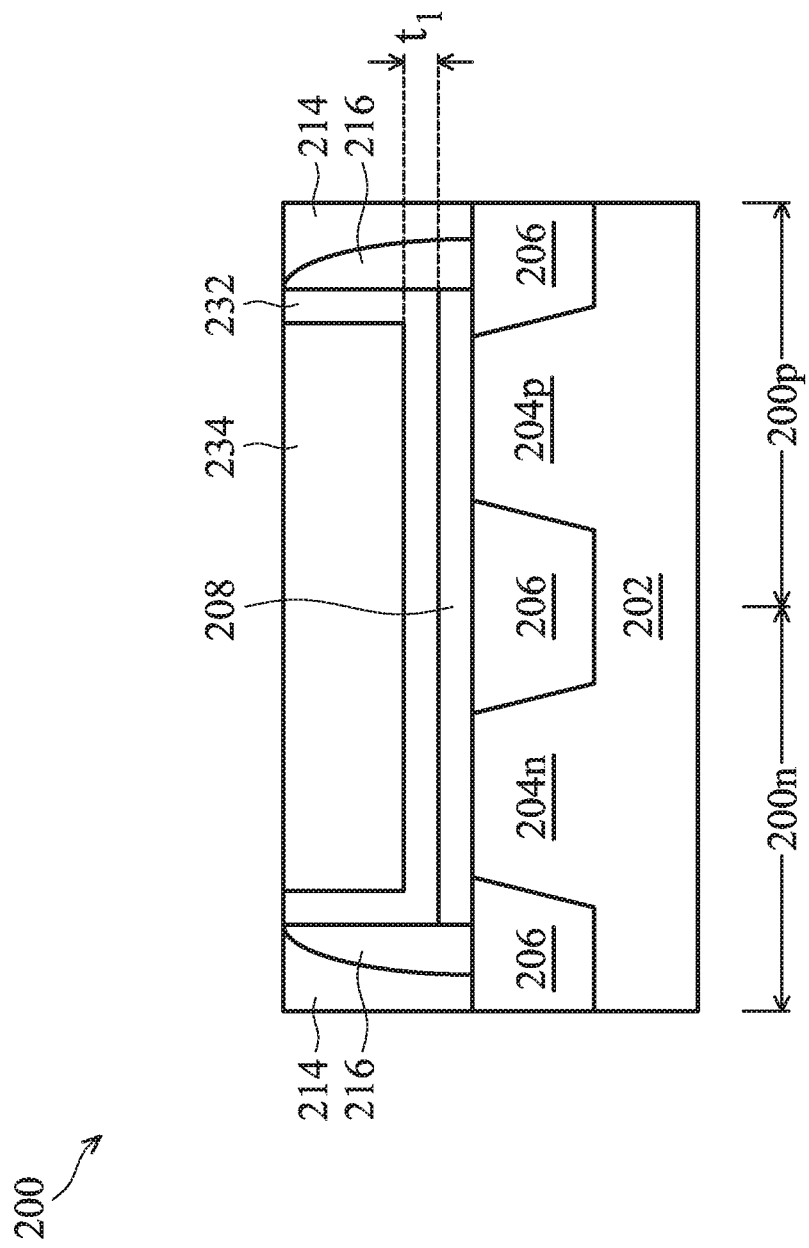

The method 100 in FIG. 1 continues with step 108 in which the structure in FIG. 7 is produced by partially filling the first opening 222 with a first metal composition 232. In the depicted embodiment, the first metal composition 232 may comprises a P-work-function metal layer. The P-work-function metal layer comprises a material selected from a group of TiN, WN, TaN, Ru, or combinations thereof. The P-work-function metal layer may be formed by CVD, PVD or other suitable technique. The P-work-function metal layer 232 has a thickness $t_1$ ranging from about 30 to 80 angstroms.

In some embodiments, the first metal composition 232 may further comprises an optional first barrier layer (not shown). The first barrier layer may be deposited before the P-work-function metal layer deposition to reduce diffusion of a signal metal layer 238 (shown in FIGS. 10-12) to the gate dielectric layer 208. Thus, in the first opening 222 the first barrier layer surrounds the P-work-function metal layer 232, and a bottom portion of the first barrier layer is between the P-work-function metal layer and gate dielectric layer 208. The first barrier layer comprises a material selected from a group of TaN and WN. The first barrier layer has a thickness ranging from 5 to 15 angstroms. The first barrier layer may be formed by CVD, PVD or other suitable technique.

In the present embodiment, the first metal composition 232 is first deposited over the gate dielectric layer 208, gate spacer 216, and ILD layer 214 to partially fill the first opening 222. The next step (depicted in FIG. 7 and step 110 of FIG. 1) is to fill the first opening 222 with a sacrificial layer 234. The sacrificial layer 234 may comprise, but is not limited to, poly-silicon, photo-resist (PR) or Spin-on glass (SOG). The sacrificial layer 234 may be formed by CVD, PVD, ALD, spin-on or other suitable technique. Then, a chemical mechanical polishing (CMP) process is performed to remove a portion of the sacrificial layer 234 and the first metal composition 232 outside of the first opening 222. Accordingly, the CMP process may stop when reaching the ILD layer 214, thus providing a substantially planar surface.

Figure 8:
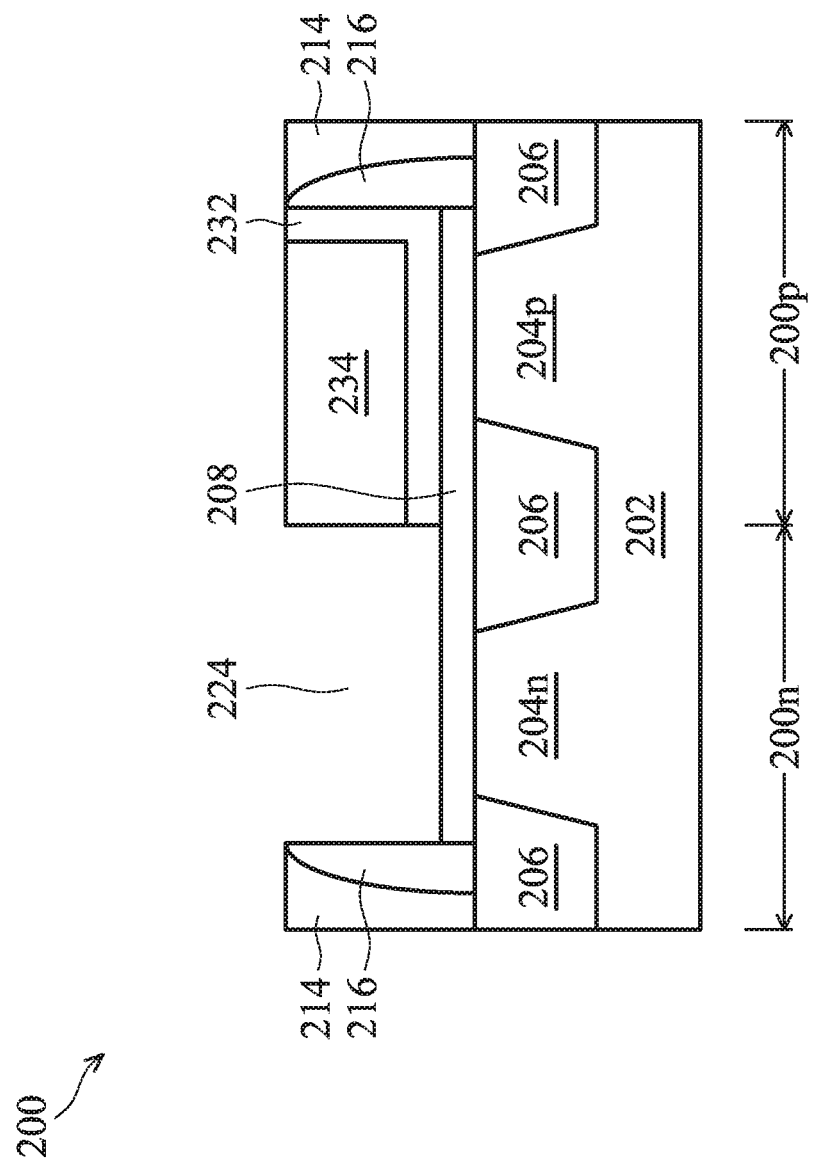

The method 100 in FIG. 1 continues with step 112 in which the structure in FIG. 8 is produced by removing a first portion of the sacrificial layer 234 and a first portion of the first metal composition 232 to form a second opening 224 extending entire length of the N-active region 204n in the ILD layer 214 and over the isolation region 206. In the present embodiment, using the ILD layer 214 as a hard mask, the first portion of the sacrificial layer 234 and the first portion of the first metal composition 232 are removed to form a second opening 224, while a second portion of the sacrificial layer 234 and a second portion of the first metal composition 232 are covered by a patterned photoresist layer (not shown).

In some embodiments, the first portion of the sacrificial layer 234 is removed by a dry etching process and/or a wet etching process to expose the first portion of the first metal composition 232. For example, if the sacrificial layer 234 comprises poly-silicon, PR, or SOG, the dry/wet etching chemistry may include F, Cl, and Br based etchants to selectively remove first portion of the sacrificial layer 234. Then, the first portion of the first metal composition 232 may be removed using a dry etch process to expose the gate dielectric layer 208. In some embodiments, the dry etch process may be performed at a temperature of about 10° C. to 50° C., under a bias power of about 100 to 1000 W and a pressure of about 1 to 40 mTorr, using $Cl_2$, HBr, $BCl_3$, $NF_3$, $N_2$, $CF_4$ and $CH_2F_2$ as etching gases.

Figure 9:
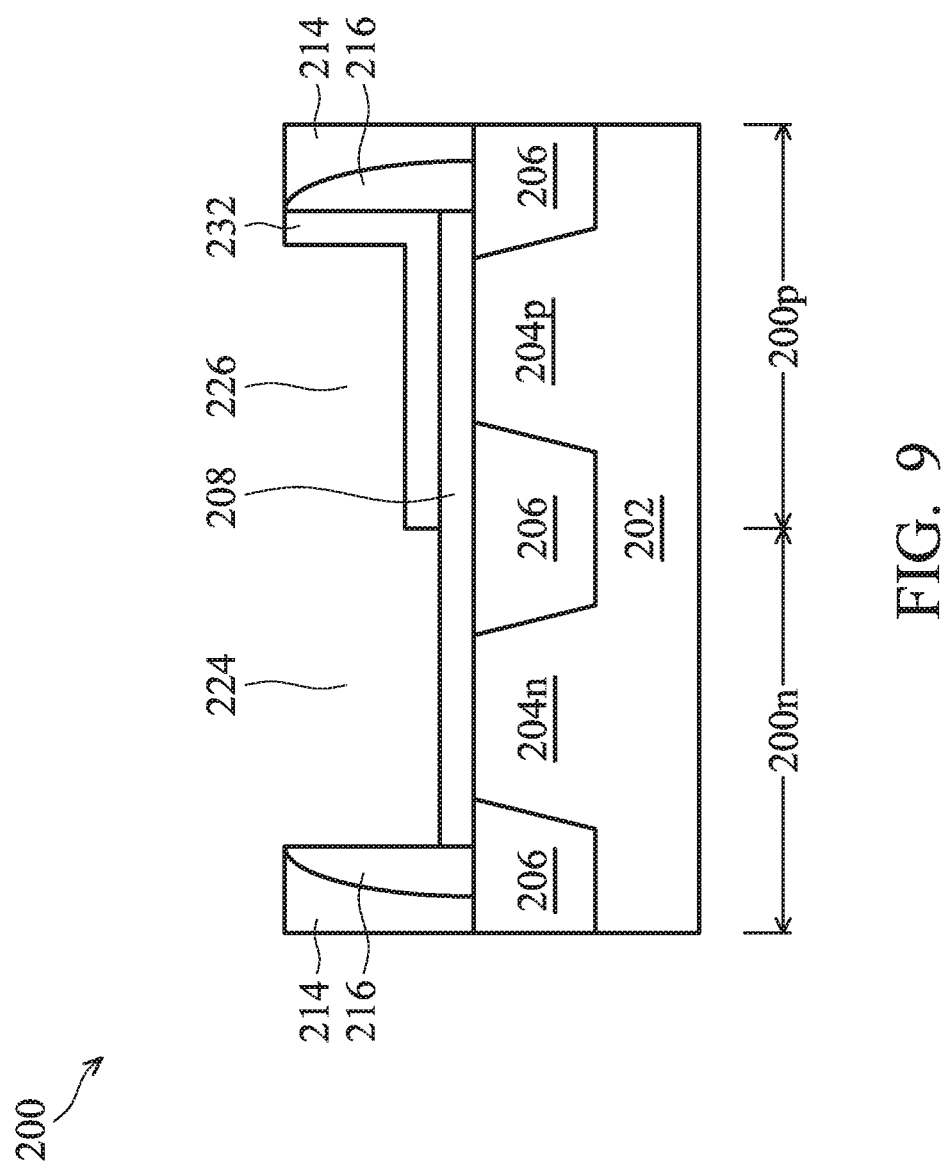

The method 100 in FIG. 1 continues with step 114 in which the structure in FIG. 9 is produced by removing the second portion of the sacrificial layer 234 to form a third opening 226 extending entire length of the P-active region 204p in the ILD layer 214 and over the isolation region 206, wherein the third opening 226 connects to the second opening 224.

In the present embodiment, using a patterned photoresist layer (not shown) to expose the second portion of the sacrificial layer 234, the second portion of the sacrificial layer 234 is removed by a dry etching process and/or a wet etching process to form the third opening 226, thereby expose a second portion of the first metal composition 232. For example, if the sacrificial layer 234 comprises polysilicon, PR, or SOG, the dry/wet etching chemistry may include F, Cl, and Br based etchants to selectively remove the second portion of the sacrificial layer 234.

Figure 10:
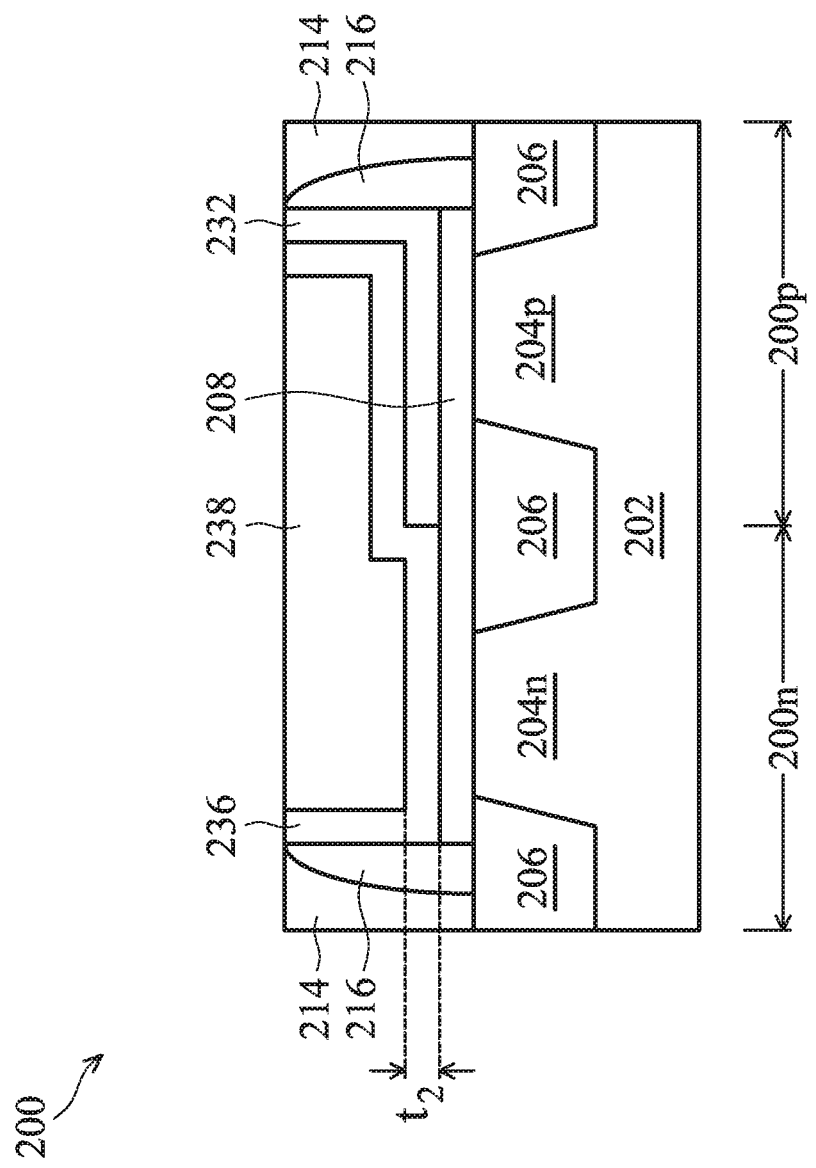

The method 100 in FIG. 1 continues with step 116 in which the structure in FIG. 10 is produced by filling the second and third openings 224, 226 with a second metal composition 236 different from the first metal composition 232. In the depicted embodiment, the second metal composition 236 may comprises an N-work-function metal layer. The N-work-function metal layer comprises a material selected from a group of Ti, Ag, Al, TiAl, TiAlN, TaC, TaCN, TaSiN, Mn, and Zr. The N-work-function metal layer has a thickness $t_2$ ranging from about 30 to 80 angstroms. The N-work-function metal layer may be formed by CVD, PVD or other suitable technique.

In some embodiments, an optional second barrier layer (not shown) may be deposited before the N-work-function metal layer deposition to reduce diffusion of the signal metal layer 238 into the gate dielectric layer 208. In the second opening 224 a bottom portion of the second barrier layer is between the N-work-function metal layer and gate dielectric layer 208. Further, in the third opening 226 the second barrier layer is between the first metal composition 232 and second metal composition 236. The second barrier layer comprises a material selected from a group of TaN and WN. The second barrier layer has a thickness ranging from 5 to 15 angstroms. The second barrier layer may be formed by CVD, PVD or other suitable technique.

Still referring to FIG. 10, an optional signal metal layer 238 may be deposited over the second metal composition 236 in the second and third openings 224, 226 to reduce gate resistance. The signal metal layer 238 comprises a material selected from a group of Al, Cu and W. The signal metal layer 238 may be formed by CVD, PVD or other suitable technique. Then, a CMP is performed to remove the signal metal layer 238 and second metal composition 236 outsides of the second and third openings 224, 226. Accordingly, the CMP process may stop when reaching the ILD layer 214, and thus providing a substantially planar surface.

In some embodiments, an optional third barrier layer (not shown) may be deposited before deposition of the signal metal layer 238 to reduce diffusion of the signal metal layer 238 into the gate dielectric 208. Thus the third barrier layer is between the second metal composition 236 and the signal metal layer 238. The third barrier layer comprises a material selected from a group of TiN, TaN and WN. The third barrier layer has a thickness ranging from 20 to 40 angstroms. The third barrier layer may be formed by CVD, PVD or other suitable technique.

Figure 11A:
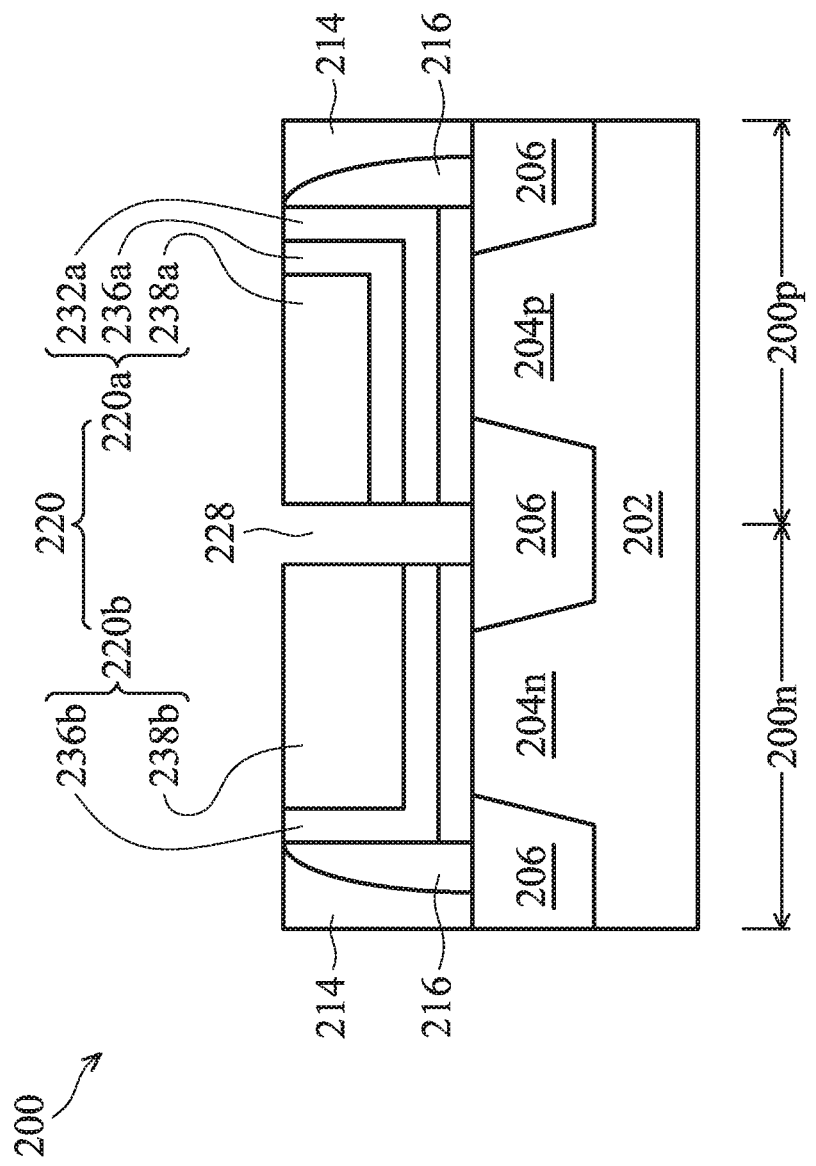
Figure 11B:
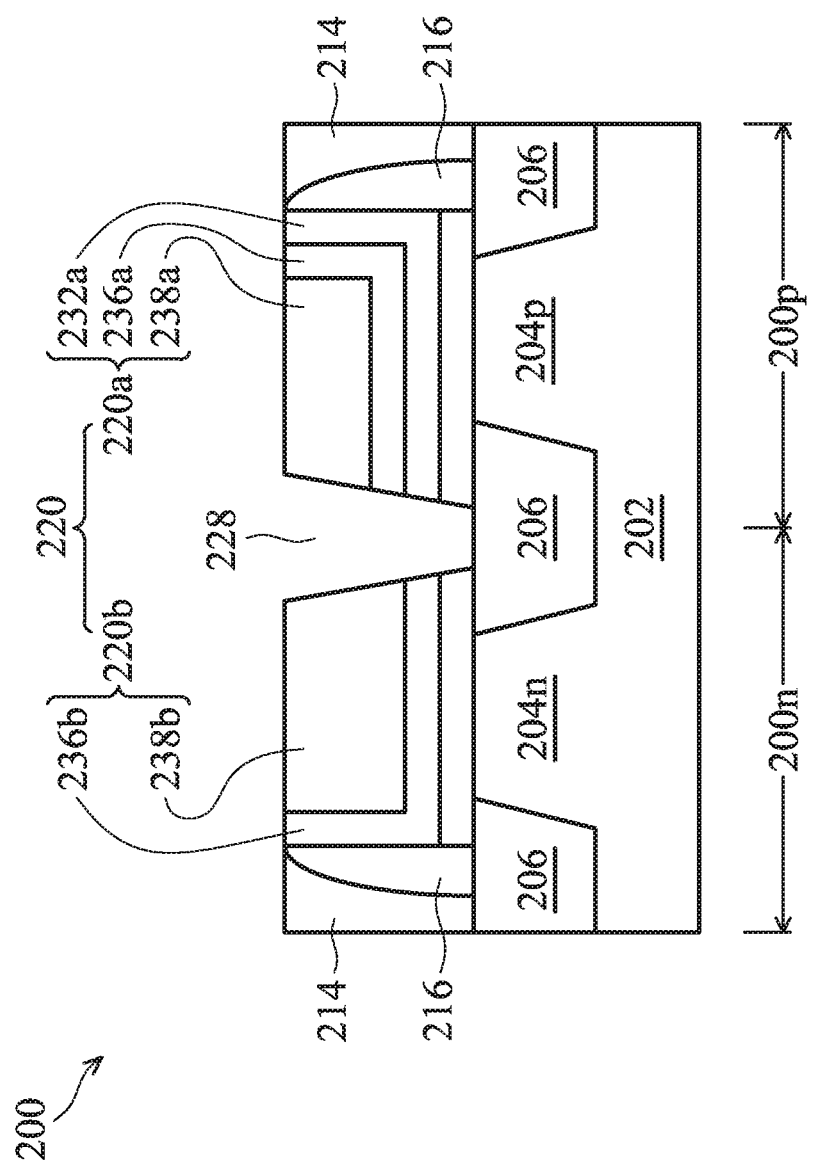
Figure 11C:
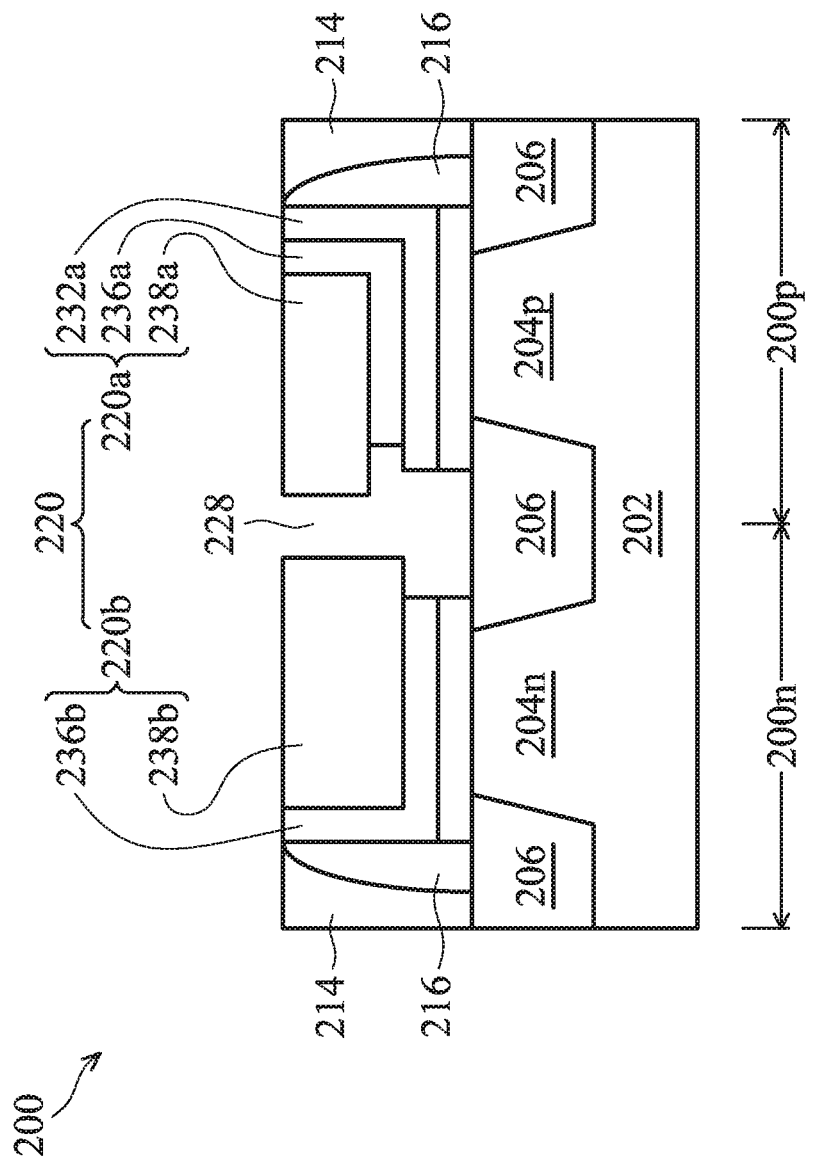

The method 100 in FIG. 1 continues with step 118 in which the structure in FIGS. 11A, 11B, and 11C is produced by removing a portion of the signal metal 238, the second metal composition 236, and the first metal composition 232, to form a fourth opening 228 over the insulation region 206. A layer of photoresist (not shown) is formed over the signal metal layer 238 by a suitable process, such as spin-on coating, and patterned by a lithography patterning method to form a patterned photoresist feature that exposes portions of the signal metal layer 238 to subsequent etch. The patterned photoresist feature can then be transferred using a dry etching process to the underlying layers (i.e., a portion of second metal composition 236 and a portion of the signal metal layer 238, and optionally a portion of the first metal composition 232 to form a fourth opening 228 over the insulation region 206. As such, the fourth opening 228 isolates the first rectangular gate electrode 220a and the second rectangular gate electrode 220b. In some embodiments, the dry etch process may be performed at a temperature of about 10° C. to 50° C., under a bias power of about 100 to 1000 W and a pressure of about 1 to 40 mTorr, using $Cl_2$, HBr, $BCl_3$, $NF_3$, $N_2$, $CF_4$ and $CH_2F_2$ as etching gas. The photoresist layer may be stripped thereafter.

In the depicted embodiment, the first layer of multilayer material comprising the remaining signal metal 238a, remaining second metal composition 236a, and remaining first metal composition 232a is referred as the first rectangular gate electrode 220a, while the second layer of multilayer material comprising the remaining signal metal 238b and remaining second metal composition 236b is referred as the second rectangular gate electrode 220b. In the depicted embodiment, the first rectangular gate electrode 220a and the second rectangular gate electrode 220b are combined and referred as the metal gate electrode 220.

In at least one embodiment, one side 220c of the first rectangular gate electrode 220a is substantially perpendicular to the major surface 202s (shown in FIG. 11A). In other embodiment, one side 220c of the first rectangular gate electrode 220a comprises a first tapered sidewall to the major surface 202s (shown in FIG. 11B). In another embodiment, one side 220c of the first rectangular gate electrode 220a comprises an irregular surface (shown in FIG. 11C). Further, configuration of the other 3 sides of the first rectangular gate electrode 220a is dependent on configuration of the dummy strip 218 (shown in FIG. 5). In some embodiments, the other 3 sides 220d, 220e, and 220f of the first rectangular gate electrode 220a are substantially perpendicular to the major surface (not shown). In some embodiments, the other 3 sides 220d, 220e, and 220f of the first rectangular gate electrode 220a comprise a second tapered sidewall to the major surface (not shown).

In at least one embodiment, one side 220w of the second rectangular gate electrode 220b is substantially perpendicular to the major surface 202s (shown in FIG. 11A). In other embodiment, one side 220w of the second rectangular gate electrode 220b comprises a third tapered sidewall to the major surface 202s (shown in FIG. 11B). In another embodiment, one side 220w of the second rectangular gate electrode 220b comprises an irregular surface (shown in FIG. 11C). Further, configuration of the other 3 sides of the second rectangular gate electrode 220b is dependent on configuration of the dummy strip 218 (shown in FIG. 5). In some embodiments, the other 3 sides 220x, 220y, and 220z of the second rectangular gate electrode 220b are substantially perpendicular to the major surface (not shown). In some embodiments, the other 3 sides 220x, 220y, and 220z of the second rectangular gate electrode 220b comprise a fourth tapered sidewall to the major surface (not shown).

Figure 12A:
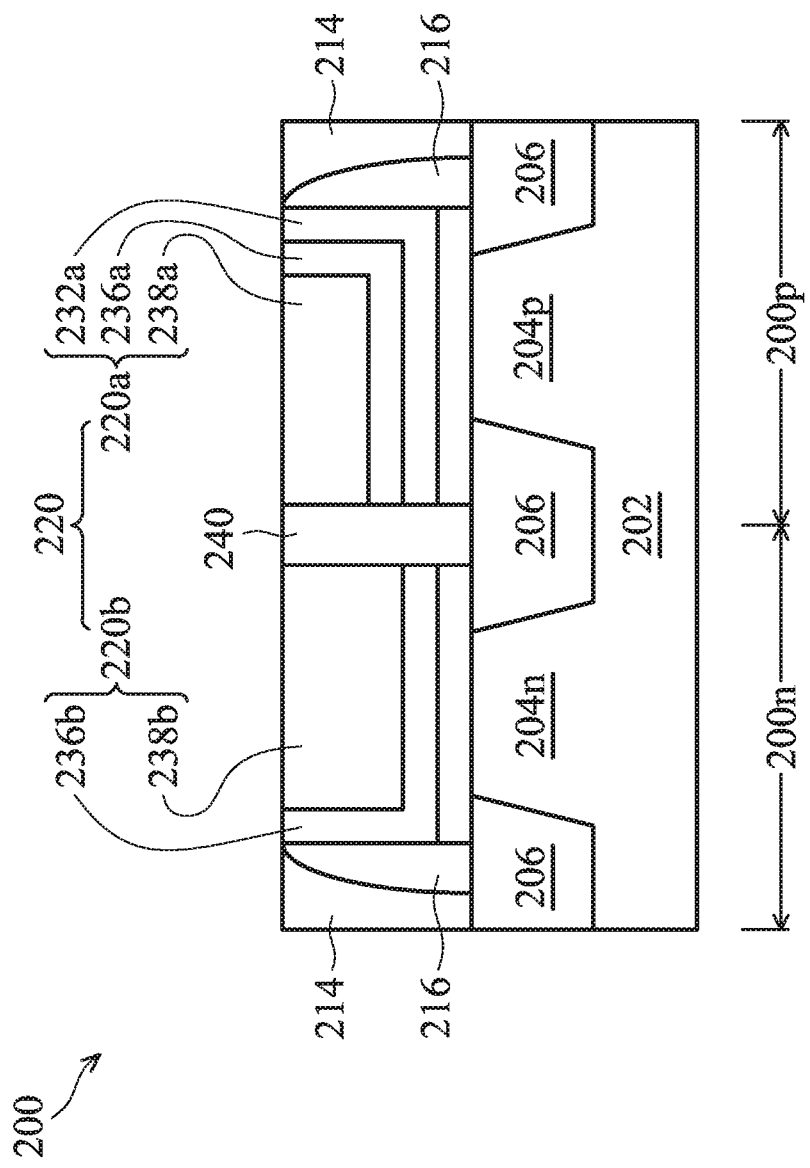
Figure 12B:
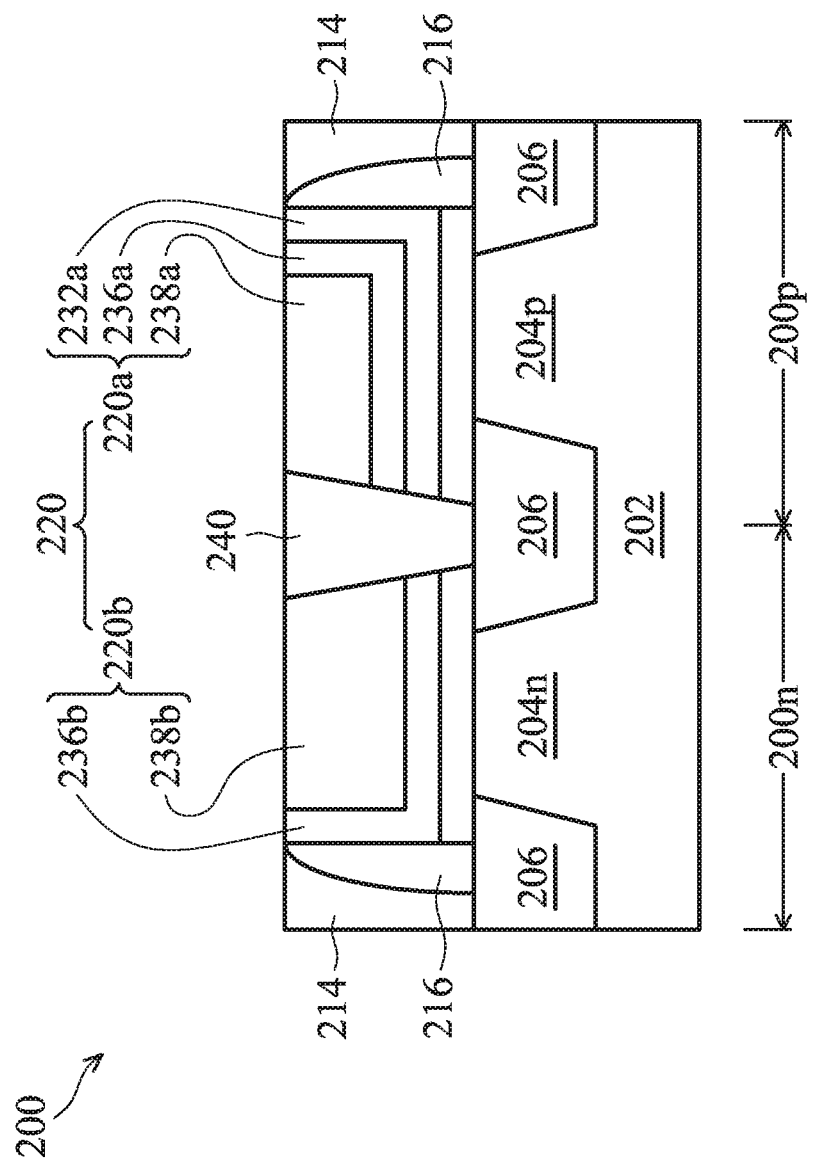
Figure 12C:
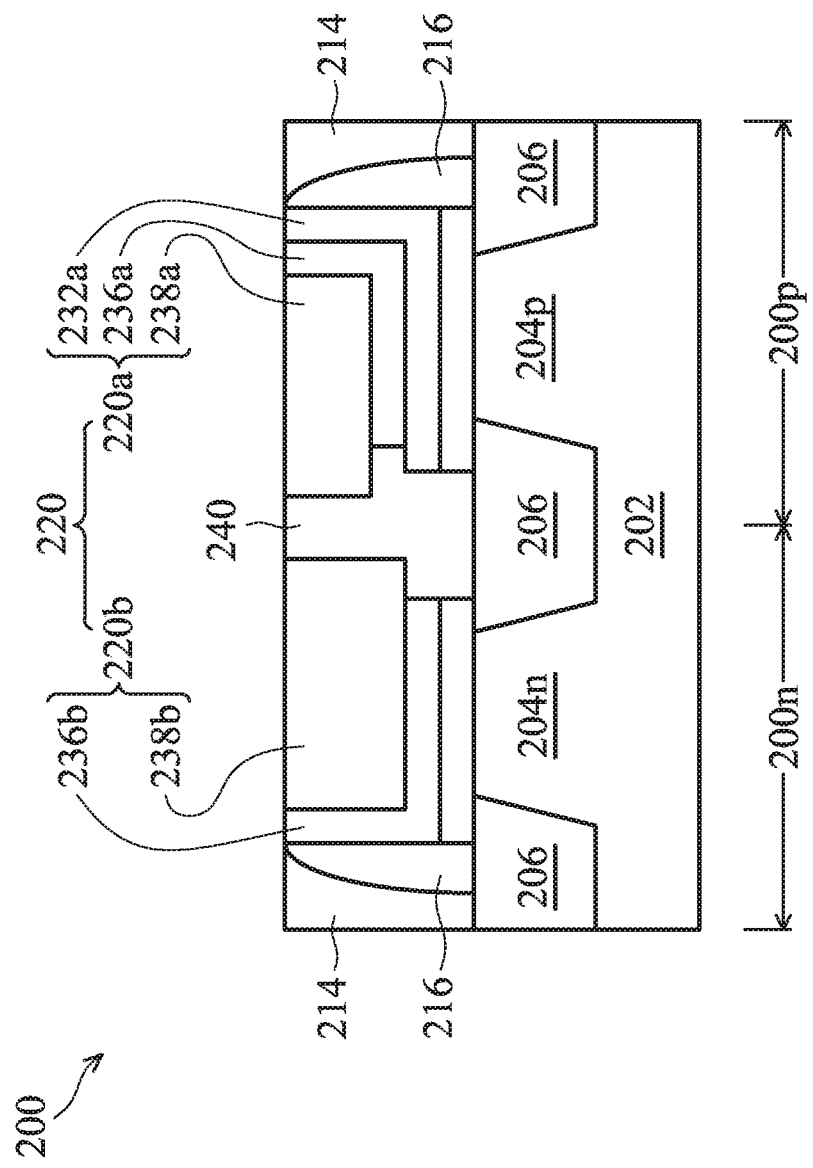

After formation of the fourth opening 228 over the insulation region 206, the structures in FIGS. 12A, 12B, and 12C are produced by filling the fourth opening 228 with a dielectric material 240 (i.e. the first dielectric material 240 in FIG. 2). In some embodiments, the dielectric layer 240 may comprise materials such as silicon oxide, silicon nitride, silicon oxynitride, fluoride-doped silicate glass (FSG), a low-k dielectric material, and/or combinations thereof. In some embodiments, the dielectric layer 240 may have a multi-layer structure such as a silicon oxide surrounding a silicon nitride. In some embodiments, the dielectric material 240 is different from the ILD layer 214. In some embodiments, the dielectric material 240 is different from the gate spacer 216.

The dielectric material 240 may be formed by CVD, PVD, spin-on process, or other suitable technique. Then, a CMP is performed to remove the dielectric material 240 outsides of the fourth opening 228. Accordingly, the CMP process may stop when reaching the signal metal layer 238, and thus providing a substantially planar surface.

It is understood that the semiconductor device 200 may undergo further CMOS processes to form various features such as contacts/vias, interconnect metal layers, dielectric layers, passivation layers, etc. It has been observed that the metal gate electrode 220 maintains its original work function, thereby not changing the threshold voltage of the semiconductor device 200.

In accordance with embodiments, a semiconductor device comprises a substrate comprising a major surface; a first rectangular gate electrode on the major surface comprising a first layer of multi-layer material; a first dielectric material adjacent to one side of the first rectangular gate electrode; and a second dielectric material adjacent to the other 3 sides of the first rectangular gate electrode, wherein the first dielectric material and the second dielectric material collectively surround the first rectangular gate electrode.

In accordance with another embodiments, a semiconductor device comprises a substrate comprising a major surface; a first rectangular gate electrode on the major surface comprising a first layer of multi-layer material; a first dielectric material adjacent to one side of the first rectangular gate electrode; a second dielectric material adjacent to the other 3 sides of the first rectangular gate electrode, wherein the first dielectric material and the second dielectric material collectively surround the first rectangular gate electrode; and a second rectangular gate electrode on the major surface comprising a second layer of multi-layer material, wherein the first dielectric material is adjacent to one side of the second rectangular gate electrode, wherein the second dielectric material is adjacent to the other 3 sides of the second rectangular gate electrode, wherein the first dielectric material and the second dielectric material collectively surround the second rectangular gate electrode.

In accordance with yet another embodiments, a method of fabricating a semiconductor device comprises providing a substrate comprising a P-active region and an N-active region separated by an isolation region; forming a dummy strip over the P-active region, the isolation region, and the N-active region in an inter-layer dielectric (ILD) layer; removing the dummy strip to form a first opening in the ILD layer; partially filling the first opening with a first metal composition; filling the first opening with a sacrificial layer; removing a first portion of the sacrificial layer and a first portion of the first metal composition to form a second opening extending entire length of the N-active region in the ILD layer and over the isolation region; removing a second portion of the sacrificial layer to form a third opening extending entire length of the P-active region in the ILD layer and over the isolation region, wherein the third opening connects to the second opening; filling the second and third opening with a second metal composition different from the first metal composition; and removing a portion of the second metal composition to form a fourth opening over the insulation region.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   removing a dummy gate to form a first recess in a semiconductor device;
   depositing a first conductive layer in the first recess;
   removing the first conductive layer from a first part of the first recess, wherein the first conductive layer remains in a second part of the first recess after the removing of the first conductive layer from the first part of the first recess;
   depositing a second conductive layer in the first part of the first recess and the second part of the first recess;
   after depositing the second conductive layer in the first part of the first recess and the second part of the first recess, forming a second recess, the second recess being defined in part by the second conductive layer in the first part and by the first conductive layer and the second conductive layer in the second part; and
   after forming the second recess, depositing a dielectric material in the second recess.

2. The method according to claim 1, further comprising:
   forming the dummy gate over a substrate, the dummy gate extending from a first channel region of the substrate to a second channel region of the substrate, wherein an isolation region is disposed between the first channel region and the second channel region.

3. The method according to claim 2, wherein forming the dummy gate comprises:
   depositing a gate dielectric layer over the substrate;
   depositing a dummy gate layer over the gate dielectric layer; and
   patterning the dummy gate layer and the gate dielectric layer, wherein after the patterning the dummy gate extends from the first channel region of the substrate to the second channel region of the substrate.

4. The method according to claim 3, further comprising:
   forming a spacer surrounding the dummy gate; and
   forming an interlayer dielectric layer surrounding the spacer.

5. The method according to claim 4, wherein the first recess is defined by the spacer.

6. The method according to claim 2, wherein the first channel region is p-type and corresponds to a first transistor, and wherein the second channel region is n-type and corresponds to a second transistor.

7. The method according to claim 1, further comprising:
depositing a third conductive layer over the second conductive layer, wherein the second recess is defined in part by the third conductive layer in the first part and in the second part.

8. The method according to claim 1, wherein the dielectric material contacts a first number of layers on a first side of the dielectric material and a second number of layers on a second side of the dielectric material, the second side being opposite to the first side, and wherein the first number is different than the second number.

9. A method, comprising:
forming a dummy layer over a substrate;
patterning the dummy layer to form a dummy gate, the dummy gate extending from a first active region of the substrate to a second active region of a substrate, the first active region of the substrate being separated from the second active region of the substrate by an isolation region of the substrate;
forming a dielectric layer surrounding the dummy gate;
removing the dummy gate to form a first recess;
filling the first recess with a plurality of conductive materials;
patterning the plurality of conductive materials to form a second recess, wherein the second recess exposes the isolation region of the substrate; and
filling the second recess with a dielectric material, wherein a first sidewall of the dielectric material extends along a first number of layers and a second sidewall of the dielectric material extends along a second number of layers, the first sidewall being opposite to the second sidewall, the first number being different than the second number, and the first sidewall and the second sidewall extending in a direction that is perpendicular to a major surface of the substrate.

10. The method according to claim 9, wherein patterning the plurality of conductive materials comprises:
forming a mask over the plurality of conductive materials;
patterning the mask to expose a surface of the plurality of conductive materials in which the second recess will be formed; and
etching the plurality of conductive materials through the mask to form the second recess.

11. The method according to claim 9, wherein the second recess isolates a first portion of the plurality of conductive materials from a second portion of the plurality of conductive materials, the first portion of the plurality of conductive materials forming a first gate electrode over the first active region of the substrate and the second portion of the plurality of conductive materials forming a second gate electrode over the second active region of the substrate.

12. The method according to claim 9, wherein filling the first recess with a plurality of conductive materials comprises:
depositing a first conductive layer and a sacrificial layer in the first recess;
removing the first conductive layer and the sacrificial layer from a first part of the first recess, and removing the sacrificial layer from a second part of the first recess, wherein the first conductive layer remains in the second part of the first recess after the removing of the first conductive layer from the first part of the first recess;
depositing a second conductive layer in the first part of the first recess and the second part of the first recess; and
depositing a third conductive layer in the first part of the first recess and the second part of the first recess.

13. The method according to claim 12, wherein the second recess is defined in part by the first conductive layer, the second conductive layer, and the third conductive layer.

14. The method according to claim 9, further comprising:
polishing the dielectric material, thereby exposing the plurality of conductive materials.

15. A method, comprising:
forming a dummy gate over a semiconductor substrate, the dummy gate overlying a plurality of active regions of the semiconductor substrate, wherein a first active region of the plurality of active regions is separated from a second active region of the plurality of active regions by an isolation region;
forming a dielectric layer adjacent the dummy gate;
removing the dummy gate to form a first recess, the dielectric layer surrounding the first recess;
depositing a plurality of metal layers in the first recess;
forming a second recess in the plurality of metal layers, the second recess exposing the isolation region, and the second recess isolating a first portion of the plurality of metal layers from a second portion of the plurality of metal layers, wherein the plurality of metal layers in the first portion comprises a first metal layer and a second metal layer, and the plurality of metal layers in the second portion comprises a third metal layer and a fourth metal layer; and
filling the second recess with a dielectric material, wherein each of the first metal layer, the second metal layer, the third metal layer, and the fourth metal layer directly contact the dielectric material.

16. The method according to claim 15, wherein the second recess comprises tapered sidewalls.

17. The method according to claim 15, wherein the first metal layer is formed simultaneously with the third metal layer, and wherein the second metal layer is formed simultaneously with the fourth metal layer.

18. The method according to claim 15, further comprising:
forming a spacer surrounding the dummy gate, the first recess being defined by the spacer.

19. The method according to claim 15, wherein a number of layers of the first portion is different than a number of layers of the second portion.

20. The method according to claim 19, wherein the second recess is defined in part by a gate dielectric layer underlying the plurality of metal layers.

* * * * *